(12) United States Patent
Yamamoto et al.

(10) Patent No.: US 7,530,749 B2
(45) Date of Patent: May 12, 2009

(54) COATER/DEVELOPER AND COATING/DEVELOPING METHOD

(75) Inventors: Taro Yamamoto, Koshi-Machi (JP); Osamu Hirakawa, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 324 days.

(21) Appl. No.: 10/581,713

(22) PCT Filed: Dec. 3, 2004

(86) PCT No.: PCT/JP2004/018061
§ 371 (c)(1),
(2), (4) Date: Jun. 5, 2006

(87) PCT Pub. No.: WO2005/067011
PCT Pub. Date: Jul. 21, 2005

(65) Prior Publication Data
US 2007/0122551 A1    May 31, 2007

(30) Foreign Application Priority Data
Jan. 7, 2004    (JP) .............................. 2004-002324

(51) Int. Cl.
*G03D 5/00*    (2006.01)
*G03B 27/52*   (2006.01)
*G03B 27/32*   (2006.01)
(52) U.S. Cl. .................... 396/611; 396/578; 355/27; 355/30
(58) Field of Classification Search ................. 396/578, 396/611; 355/27, 30, 53; 430/311; 134/61, 134/104.4, 902; 118/712
See application file for complete search history.

(56) References Cited

U.S. PATENT DOCUMENTS 5,610,683 A * 3/1997 Takahashi ..................... 355/53

(Continued)

FOREIGN PATENT DOCUMENTS

JP    63-73628    4/1988

(Continued)

OTHER PUBLICATIONS

English translation of JP 6-124873 (dated May 6, 1994).*

(Continued)

*Primary Examiner*—Alan A Mathews
(74) *Attorney, Agent, or Firm*—Oblon, Spivak, McClelland, Maier & Neustadt, P.C.

(57) ABSTRACT

A coating and developing system prevents wetting its component units with water when the coating and developing system forms a resist film on a substrate and processes the substrate processed by immersion exposure by a developing process. A substrate having a surface coated with a resist film and processed by immersion exposure is placed on a substrate support device and a liquid detector detects at least the liquid formed a liquid film for immersion exposure and remaining on the surface of the substrate. A decision is made as to whether or not the substrate needs to be dried on the basis of the result of detection made by the liquid detector. If it is decided that the substrate needs to be dried, the substrate is dried by a drying means. Thus wetting the interior of the coating and developing system with water can be prevented. Since only substrates that need to be dried are subjected to a drying process, the coating and developing system is able to operate at a high throughput.

6 Claims, 13 Drawing Sheets

U.S. PATENT DOCUMENTS 7,070,915 B2 * 7/2006 Ho et al. .................... 430/322
2006/0257553 A1 11/2006 Ohta et al.

FOREIGN PATENT DOCUMENTS

| JP | 6-124873 | 5/1994 |
| JP | 6-168866 | 6/1994 |
| JP | 2005-183709 | 7/2005 |

OTHER PUBLICATIONS

English translation of JP 2005-183709 (dated Jul. 7, 2005).*

* cited by examiner

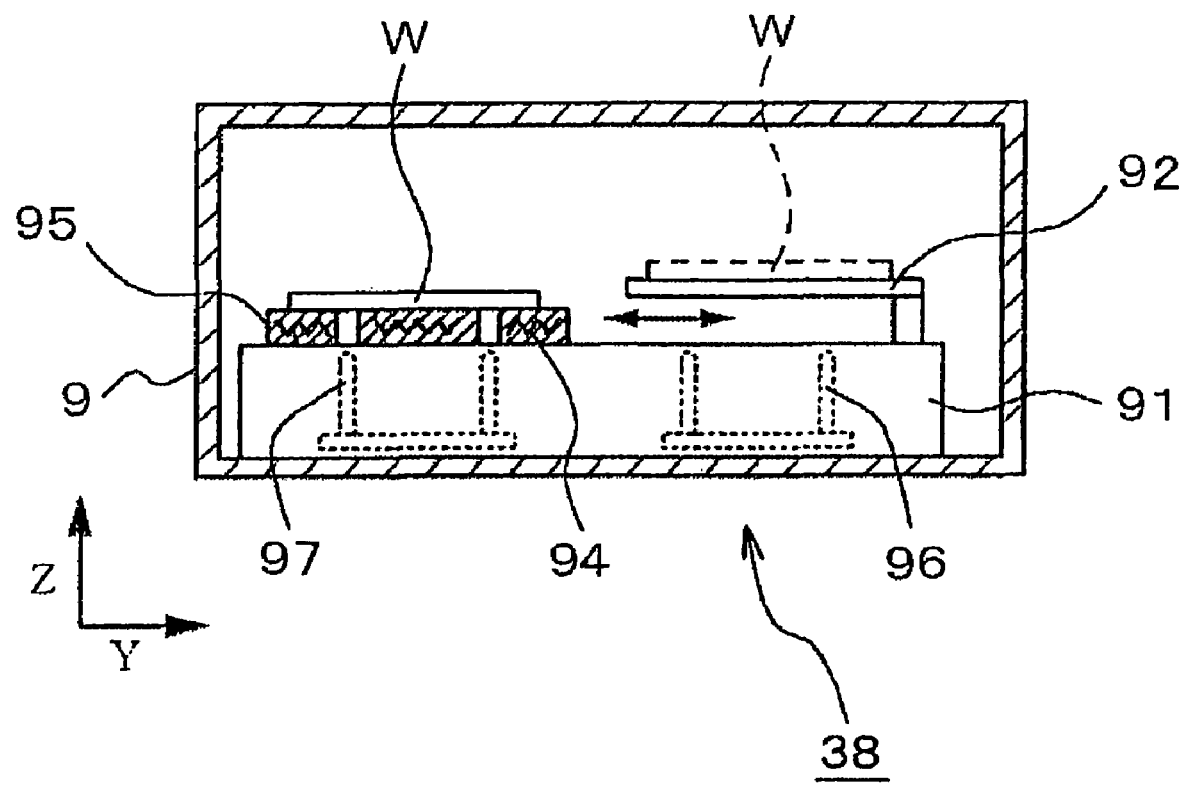
F I G. 9

COATER/DEVELOPER AND COATING/DEVELOPING METHOD

TECHNICAL FIELD

The present invention relates to a coating and developing system and a coating and developing method for coating a surface of a substrate with a resist film and processing the substrate by a developing process after the substrate has been processed by immersion exposure.

BACKGROUND ART

A conventional photoresist pattern forming process, which is one of semiconductor device fabricating processes, includes the steps of forming a resist film on a surface of a semiconductor wafer (hereinafter, referred to simply as "wafer") by applying a resist to the surface of the wafer, exposing the resist film in a predetermined pattern, and developing the exposed resist film. Generally, this photoresist pattern forming process is carried out by a system built by connecting an exposure system to a coating and developing system, Improve of exposure resolution has been desired to cope with the progressive miniaturization of device patterns and the progressive thickness reduction of films. While exposure techniques using EUVL, EUV and $F_2$ light sources have been developed to improve exposure resolution, immersion exposure has been studied to improve resolution through the further improvement of the existing exposure techniques using existing ArF and KrF light sources. There is a strong trend of the semiconductor device industry and the semiconductor device fabricating system industry toward extending the life of the ArF exposure system as long as possible for financial advantages. Some have an opinion that an ArF light source is used when a desired resolution is 45 nm or above and the use of the EUV light source (extreme ultraviolet light source) will be postponed. Immersion exposure exposes an object to light through, for example, a pure water film. Immersion exposure utilizes the characteristic of light that the wavelength of light shortens in water. For example, the wavelength of ArF light shortens from 193 nm in air to about 134 nm in water.

An exposure system that carries out an immersion exposure process will be briefly described with reference to FIG. 16. An exposure device 1 is placed opposite to a surface of a wafer W held in a horizontal position by a wafer holding mechanism, not shown. The exposure device 1 is provided on its head with a lens 10. Light emitted by a light source, not shown, such as an ArF light source or a KrF light source, travels through the lens 10 and a pattern mask and falls on a resist film formed on the surface of the wafer W to form a latent image of a circuit pattern in the resist film. The head of the exposure device 1 is provided with a pouring hole 11, through which a transparent liquid, such as ultrapure water, is poured, and a suction hole 12. Water is poured through the pouring hole 11 onto a surface of a wafer W to form a water film between the lens 10 and the surface of the wafer W. The water wetting the surface of the wafer W is recovered by sucking the water through the suction hole 12. Thus the transparent water film fills up the gap between the lens 10 and the surface of the wafer W. Light traveled through the lens 10 travels through the water film and falls on the resist film to form a latent image of a predetermined pattern. Then, the wafer W coated with the water film is translated to align the next exposure field in the surface of the wafer W with the exposure device 1 and then the next exposure field is exposed. Thus exposure fields in the surface of the wafer W are exposed successively by step-and-repeat exposure.

DISCLOSURE OF THE INVENTION

Problem to be Solved by the Invention

The foregoing immersion exposure system forms a liquid film, such as water film, on the surface of the wafer and exposes an exposure field through the liquid film. Therefore, in some cases, surface tension holds water on the surface of the wafer W after immersion exposure. In a normal state, it is supposed that water remains in minute water drops on the surface of the wafer W such that the entire or some parts of the surface of the wafer W look cloudy. However, it is possible that water remains in large water drops on the surface of the wafer W in an unexpected abnormal state. Therefore, there is the possibility that the units of the system, such as a coating unit and a developing unit, are wetted.

When a wafer W wetted with water is subjected to a temperature adjusting process, such as a heating process, water absorbs latent heat of vaporization from wetted parts of the wafer W. Consequently, wet parts and dry parts of the wafer W are heated respectively at different temperatures, temperature is distributed in the surface of the wafer W in an irregular intrasurface temperature distribution and in an unsatisfactory temperature profile. Usually, a resist film of a chemically amplified resist is subjected to a heating process, such as a post exposure baking process (PEB process) to heat the wafer W at temperatures in the range of 120 to 130° C. immediately after the exposure process to diffuse an acid catalyst produced on the surface of the resist layer during the exposure process in the resist layer. If the wafer W has an irregular intrasurface temperature distribution, a catalytic reaction in the presence of the acid catalyst proceeds irregularly in the resist film. Consequently, a resist pattern of lines having different line widths is formed when the resist film is developed.

The deterioration of the temperature profile on the wafer W may be restrained when the wafer W is processed by a drying process to remove the water remaining on the wafer before subjecting the wafer W to the temperature adjusting process. When many wafers W are processed successively, the condition of water remaining on the wafer W is dependent on the condition of the wafer W; that is, wafers W respectively provided with resist films of different resists and respectively having different mask patterns are wetted in different conditions, respectively. Therefore, the throughput of the system is low if all the exposed wafers W are processed by one and the same drying process. Thus processing all the wafers W by one and the same drying process is unpractical.

Therefore, it is wise not to bring a substrate processed by an immersion exposure process and having surfaces wetted with a liquid that formed a liquid film for immersion exposure, such as water, in a substrate processing block. Further studies of the constitution of the system are important to process exposed substrates properly.

The present invention has been made in view of such circumstances and it is therefore an object of the present invention to provide a coating and developing system and a coating and developing method capable of preventing wetting the interior of a developing unit when the developing unit processes a substrate coated with a resist film and processed by an immersion exposure process by a developing process and of operating at a high throughput. Another object of the present invention is to form a resist pattern accurate in line width and having intrasurface uniformity.

Means for Solving the Problem

A coating and developing system according to the present invention includes a coating unit for coating a surface of a substrate with a resist film and a developing unit for processing the substrate processed by an immersion exposure process that forms a liquid film on the surface of the resist film for immersion exposure by a developing process using a developer, and is characterized by: an inspection unit including a substrate support device for supporting the exposed substrate and a liquid detector capable of detecting at least a liquid used for forming the liquid film and adhering to the surface of the substrate supported by the substrate support device; a controller for determining whether or not the substrate needs to be processed by a drying process on the basis of a result of detection made by the liquid detector; and a drying means for drying the substrate if the controller decides that the substrate needs to be processed by a drying process.

The controller has a function to send a signal indicating an abnormal state to an exposure system processed the substrate by an immersion exposure process when the result of detection made by the liquid detector indicates an abnormal state and a function to determine drying conditions for drying the substrate on the basis of the result of detection made by the liquid detector and to control drying operations of the drying means on the basis of the drying conditions. The coating and developing system may further includes a heating unit for processing the exposed substrate by a heating process before the exposed substrate is subjected to a developing process, wherein the liquid adhering to the surface of the substrate is detected at least before the substrate is subjected to the drying process. The coating and developing system may further include a processing block including the coating unit and the developing unit; and an interface block disposed contiguously with the processing block and connected to an exposure system for processing the substrate by an immersion exposure process; wherein the inspection unit and the drying means may be included in the interface block. The coating and developing system may further include a first substrate carrying device for carrying the substrate between the processing block and the interface block, and a second carrying device for carrying the substrate between the interface block and the exposure system, wherein the substrate support device of the inspection unit may serve also as a transfer device on which the substrate placed when the substrate is transferred between the first and the second carrying device.

A coating and developing method according to the present invention, which coats a surface of a substrate with a resist film and processes the substrate processed by an immersion exposure process that forms a liquid film on the surface of the resist film for immersion exposure by a developing process by a developer, includes the steps of: supporting the substrate by a substrate support device; detecting at least a liquid forming the liquid film formed on the substrate and adhering to the surface of the substrate by a liquid detector; determining whether or not the substrate needs to be dried on the basis of the result of detection made by the liquid detector; and drying the substrate by a drying means when it is decided that the substrate needs to be dried.

The step of deciding whether or not the substrate needs to be dried may include sending a signal indicating an abnormal state to an exposure system processed the substrate by an immersion exposure process when the result of detection made by the liquid detector indicates an abnormal state and determining drying conditions for drying the substrate on the basis of the result of detection made by the liquid detector, and the drying means may dry the substrate on the basis of the drying conditions.

The coating and developing method according to the present invention may further include the step of processing the exposed substrate by a heating process before the substrate is subjected to the developing process, and the liquid adhering to the surface of the substrate may be detected before the substrate is subjected to the heating process.

According to the present invention, the liquid detector inspects the surface of the substrate to see if the surface of the substrate exposed through the liquid film is wetted with the liquid, such as water, the substrate is delivered to the next process if the surface of the substrate is not wetted with the liquid or the substrate is delivered to the next process after the substrate has been processed by the drying process if the surface of the substrate is wetted with the liquid. Thus the interior of the units of the coating and developing system can be prevented from being wetted. When many wafers are processed by the coating and developing system, not all the wafers are processed by the drying process and hence the reduction of the throughput can be prevented.

According to the present invention, the substrate delivered to the next is not wetted with the liquid or is scarcely wetted with the liquid. Therefore, the deterioration of temperature profile due to absorption of latent heat of vaporization from the wafer W can be prevented even if the next process is a heating process, such as a PEB process. Consequently, a resist pattern having line width accuracy having intrasurface uniformity can be formed.

BRIEF DESCRIPTION OF THE DRAWINGS

FIG. 9 is a longitudinal sectional view of a heating unit included in the coating and developing system;

BEST MODE FOR CARRYING OUT THE INVENTION

Figure 1:
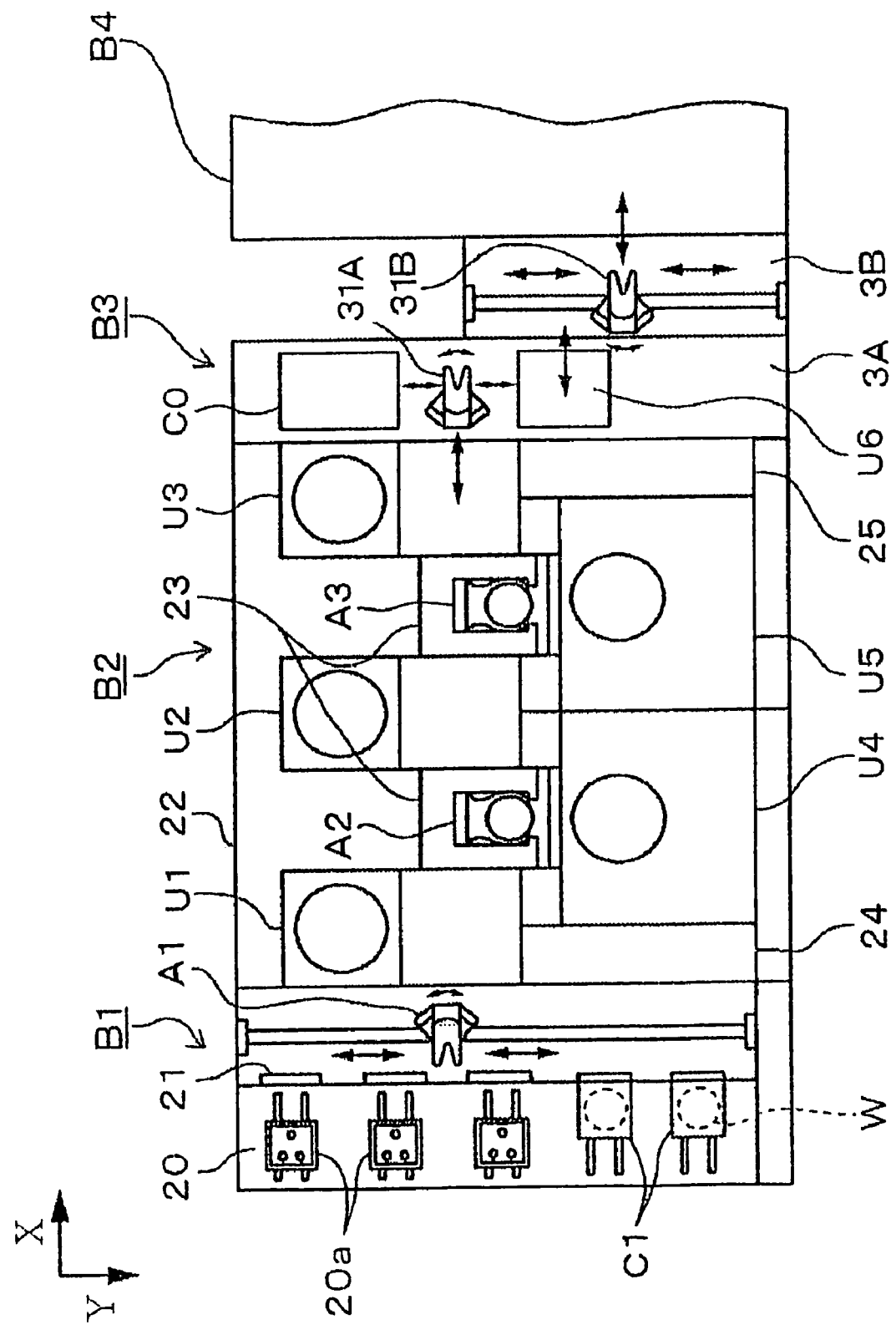
FIG. 1 is a plan view of a coating and developing system in a preferred embodiment according to the present invention.
Figure 2:
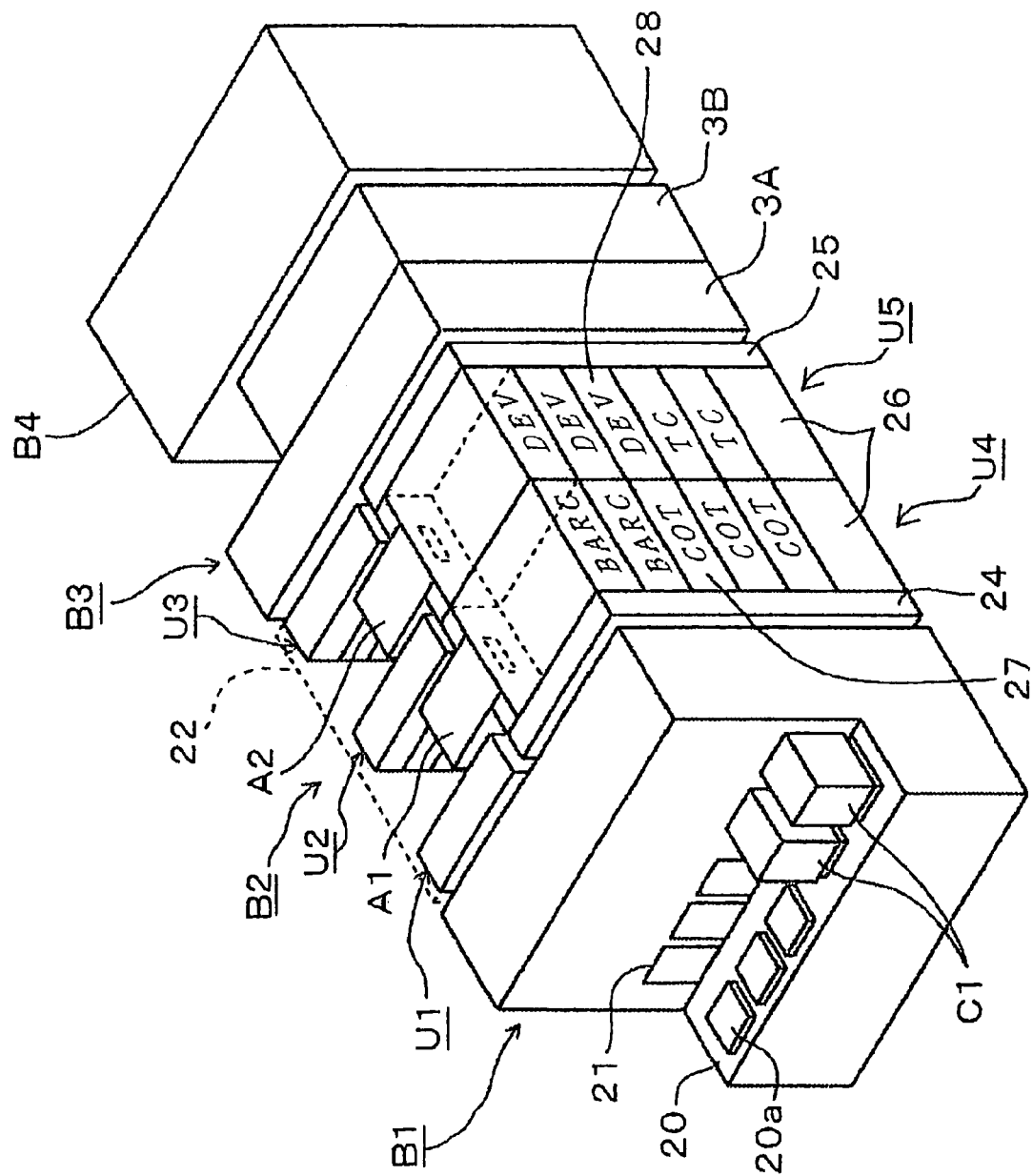
FIG. 2 is a perspective view of the coating and developing system.
Figure 3:
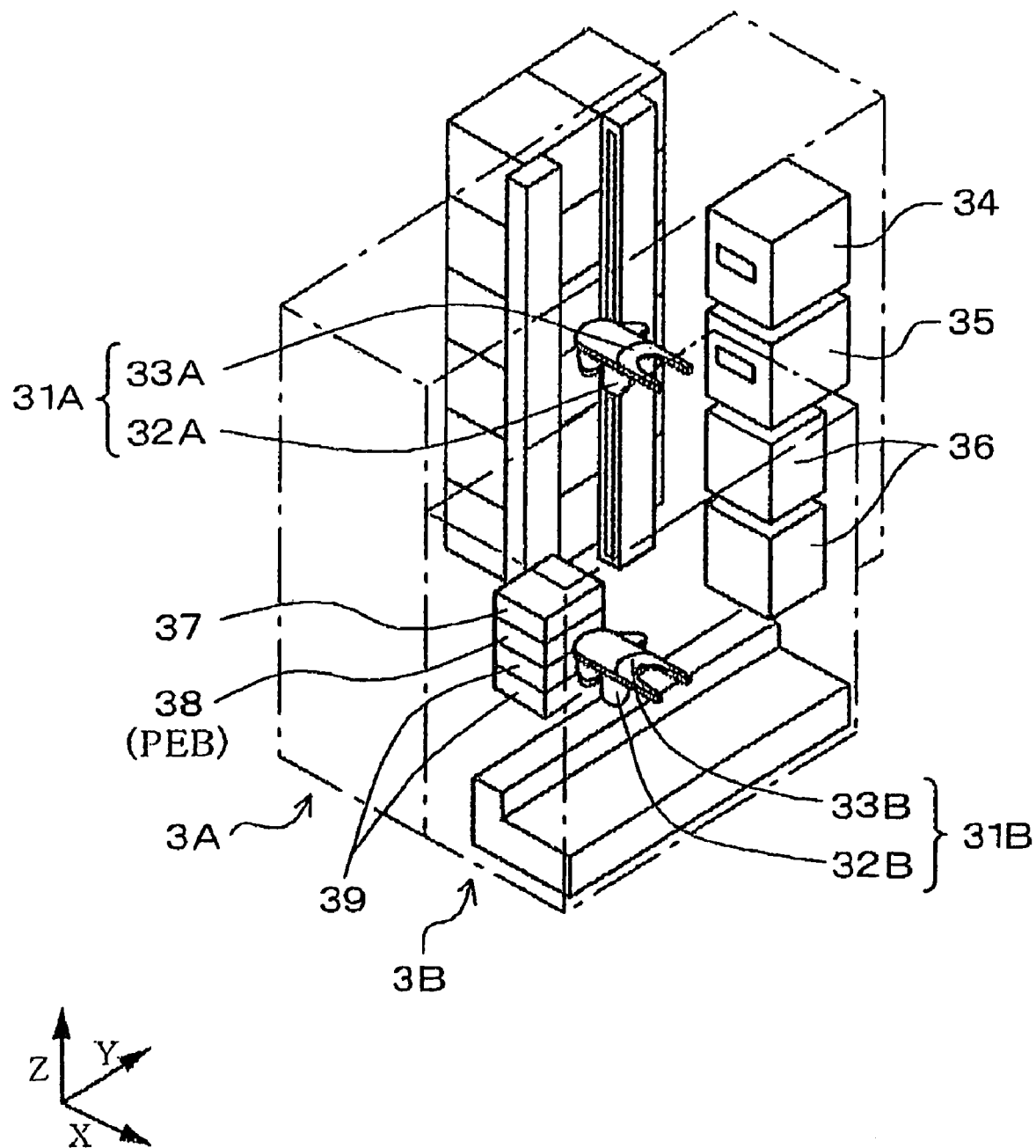
FIG. 3 is a perspective view of an interface block included in the coating and developing system.

The constitution of a system formed by connecting an exposure system to a coating and developing system in a preferred embodiment according to the present invention will be briefly described with reference to FIGS. 1 to 3. Referring to FIGS. 1 to 3, a carrier 2 containing, for example, thirteen wafers W is delivered to and sent out from a carrier handling block B1. The carrier handling block B1 has a carrier station 20 provided with carrier support tables 20a capable of supporting a plurality of carriers 2 thereon, respectively, gates 12 formed in a wall behind the carrier support table 20a, and a transfer device A1 capable of extending through the gate to the carrier 2 to take out the wafer W from the carrier 2.

A processing block B2 surrounded by a casing 22 is connected to the back end of the carrier handling block B1. The processing block B2 includes three shelf units U1, U2 and U3 each formed by stacking up heating and cooling systems in layers, liquid-processing units U4 and U5, and main carrying devices A2 and A3 for carrying a wafer W from and to the component units of the liquid-processing units U4 and U5. The shelf units U1, U2 and U3 and the main carrying devices A2 and A3 are arranged alternately in a row. As viewed from the side of the carrier handling block B1, the shelf units U1, U2 and U3 are arranged in a longitudinal row in a left part of the processing block B2 and the liquid-processing units U4 and U5 are disposed in a right part of the processing block B2. The main carrying device A2 is placed in a space defined by the opposite side surfaces of the shelf units U1 and U2, the inner side surface of the liquid-processing unit U4 and a back wall 23. The main carrying device A3 is placed in a space defined by the opposite side surfaces of the shelf units U2 and U3, the inner side surface of the liquid-processing unit U5 and a back wall 23. Temperature and humidity control units 24 and 25 include temperature controllers for controlling the temperatures of processing liquids used by the units, and ducts for air conditioning.

The liquid-process units U4 and U5 are built by stacking up, for example, coating units (COT) 27, developing units (DEV) 28 and hydrophobicity imparting units (BARC) and such in, for example, five layers on chemical solution containing units 26 for containing a liquid resist and a developer as shown in FIG. 2. The shelf units U1. U2 and U3 are built by stacking processing units that process a wafer by pretreatment processes before the wafer is processed by the liquid-processing units U4 and U5 and by posttreatment processes after the wafer has been processed by the liquid-processing units U4 and U5, respectively, in, for example, ten layers. The processing units included in each of the shelf units U1, U2 and U3 include heating units (baking units) for heating a wafer W and cooling units for cooling a wafer W An interface block B3 is disposed behind the shelf unit U3 of the processing block B2, and a developing system B4 is connected to the interface block B3. As shown in FIG. 3, the interface block B3 includes transfer chambers 3A and 3B longitudinally arranged between the processing block B2 and the exposure system B4. A first substrate carrying device 31A and a second substrate carrying device 31B are placed respectively in the transfer chambers 3A and 3B. The first substrate carrying device 31A includes a base 32A capable of being vertically moved and of being turned about a vertical axis, and an arm 33A supported on the base 32A for forward and backward movements. The second substrate carrying device 31B includes a base 32B capable of being vertically moved and of being turned about a vertical axis, and an arm 33B supported on the base 32B for forward and backward movements. As viewed from the side of the carrier handling block B1, a wafer edge exposure device (WEE) 34 for selectively exposing only an edge part of a wafer W, a drying unit 35 provided with a drying device for drying a wafer W and two buffer cassettes 36 (SUB) 36 for temporarily holding, for example, twenty-five wafers W are stacked up vertically on the left side of the main carrying device A1 in the first transfer chamber 3A. As viewed from the side of the carrier handling block B1, an inspection unit 37 for inspecting the wafer W for a liquid, such as water, remaining on a surface of a wafer W, which serves also as a transfer unit (TRS3), a heating unit (PEB) 38 for processing an exposed wafer W by a PEB process, and two precision temperature adjusting units (CPL2) 39 each provided with a cooling plate are stacked up on the right side of the main carrying device A1 in the first transfer chamber 3A.

Drying Unit

Figure 4:
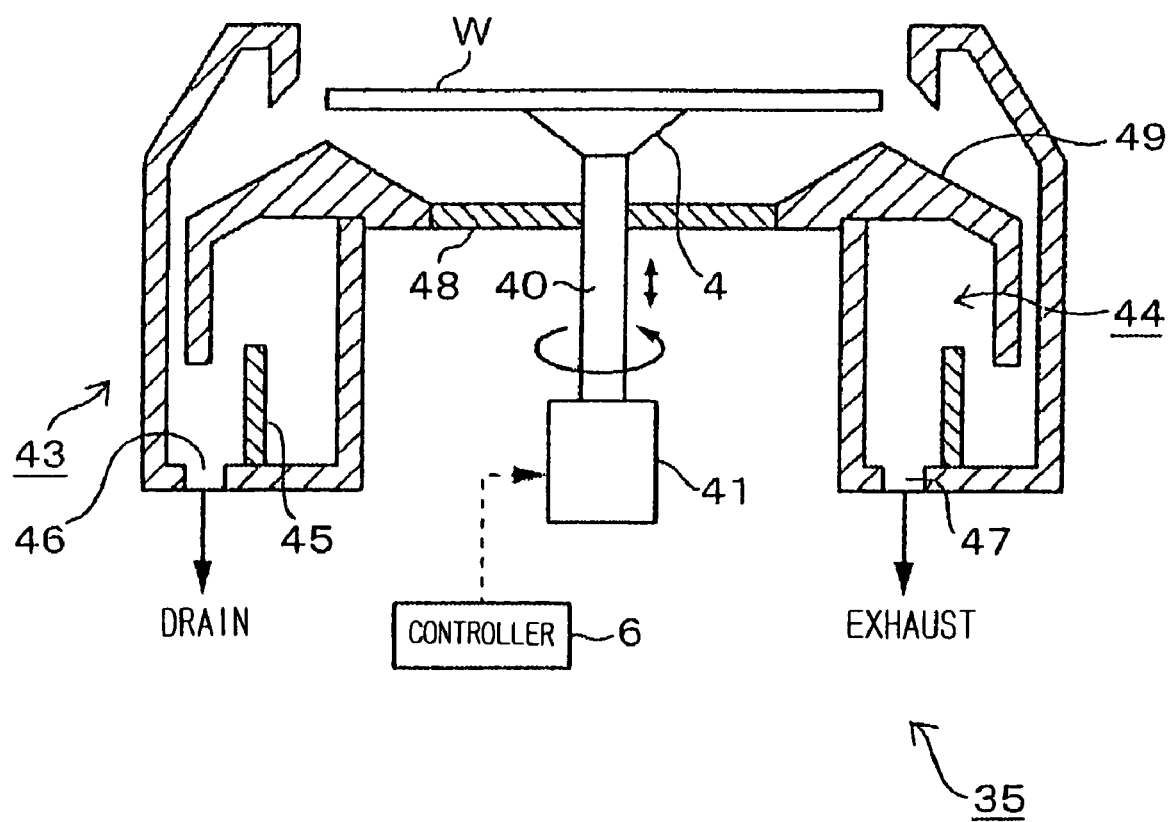
FIG. 4 is a longitudinal sectional view of a drying unit included in the coating and developing system.

The configuration of the drying unit 35 will be described with reference to FIG. 4. Referring to FIG. 4, a spin chuck 4, namely, a substrate holding device, holds a central part of a wafer W seated thereon in a horizontal position by suction. The spin chuck 4 has a shaft 40 interlocked with a driving mechanism 41. The driving mechanism 41 drives the spin chuck 4 holding the wafer W for rotation and vertical movement. A controller 6 controls the driving mechanism 41 to rotate the spin chuck 4 at a predetermined rotating speed for a predetermined time. The spin chuck 4 serves as both a substrate holding device and a drying device which spin-dries a wafer W by rotating the wafer W at a high rotating speed to shake of a liquid, such as water, adhering to a surface of the wafer W by centrifugal force. A cup structure 43 having an open upper end is disposed so as to surround the wafer W held by the spin chuck 4. A lower part of the cup structure 43 is bent so as to form a liquid containing space 44 extending under an edge part of the wafer W. The liquid containing space 44 is divided by a partition wall 45 into a drain chamber and an exhaust chamber. A drain port 46 is formed in a part of the bottom wall of the cup structure 43 corresponding to the drain chamber, and a discharge port 47 is formed in a part of the bottom wall of the cup structure 43 corresponding to the exhaust chamber. A circular plate 48 is disposed on the inner side of the drain port 46. The circular plate 48 is surrounded by a ring 49. Lifting pins, not shown, extend through the circular plate 48. A wafer W is transferred to and from the spin chuck 4 by the cooperative operation of, for example, the substrate carrying device 31A and the lifting pins.

Transfer Unit

Figure 5:
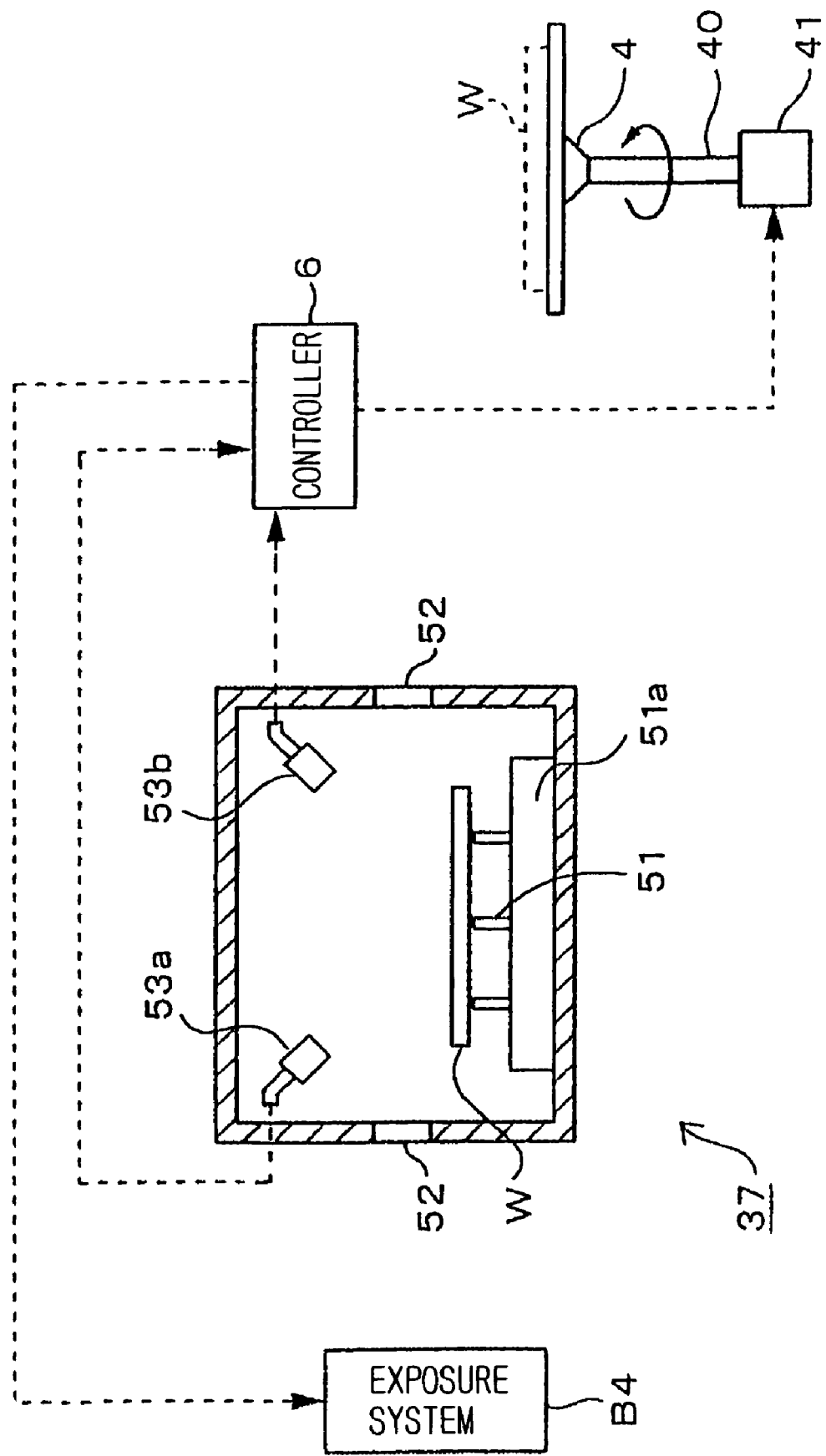
FIG. 5 is a longitudinal sectional view of an inspection unit included in the coating and developing system.

The inspection unit 37, which serves also as a transfer unit (TRS), and a control system related with the inspection unit 37 will be described with reference to FIG. 5. A stage 51a is placed in a casing 5 included in the inspection unit 37. Three substrate support pins 51, in an example, for supporting a wafer W thereon are set upright on the upper surface of the stage 51a. An opening 52 is formed in a side wall of the casing 5. A wafer W is carried through the opening 52 into the casing 5 by the first substrate carrying device 31A or the second substrate carrying device 31B. For example, to transfer a wafer W from the exposure system B4 to the processing block B2, the second substrate carrying device 31B carries the wafer W from the exposure system B4 onto the substrate support pins 51, and then the first substrate carrying device 31A takes out the wafer W from the casing 5 and carries the wafer W to the processing block B2. Thus the wafer is transferred between the exposure system B4 and the processing block B2 by transferring the wafer W between the first substrate carrying device 31A and the second substrate carrying device 31B via the substrate support pins 51.

CCD cameras 53a and 53b are disposed at positions above diametrically opposite edge parts of a wafer W supported on the substrate support pins 51, respectively. The CCD cameras 53a and 53b are liquid detectors capable of forming images of the upper surface of the wafer W and of detecting a liquid, such as water, wetting the upper surface of the wafer W. Image data provided by the CCD cameras 53a and 53b is sent to and is processed by the controller 6. A single CCD camera may be used instead of the two CCD cameras 53a and 53b. Water remaining on the wafer W can be accurately detected by obtaining image data by the CCD cameras 53a and 53b and by carrying out the logical AND between the image data provided by the CCD cameras 53a and 53b.

Figure 6:
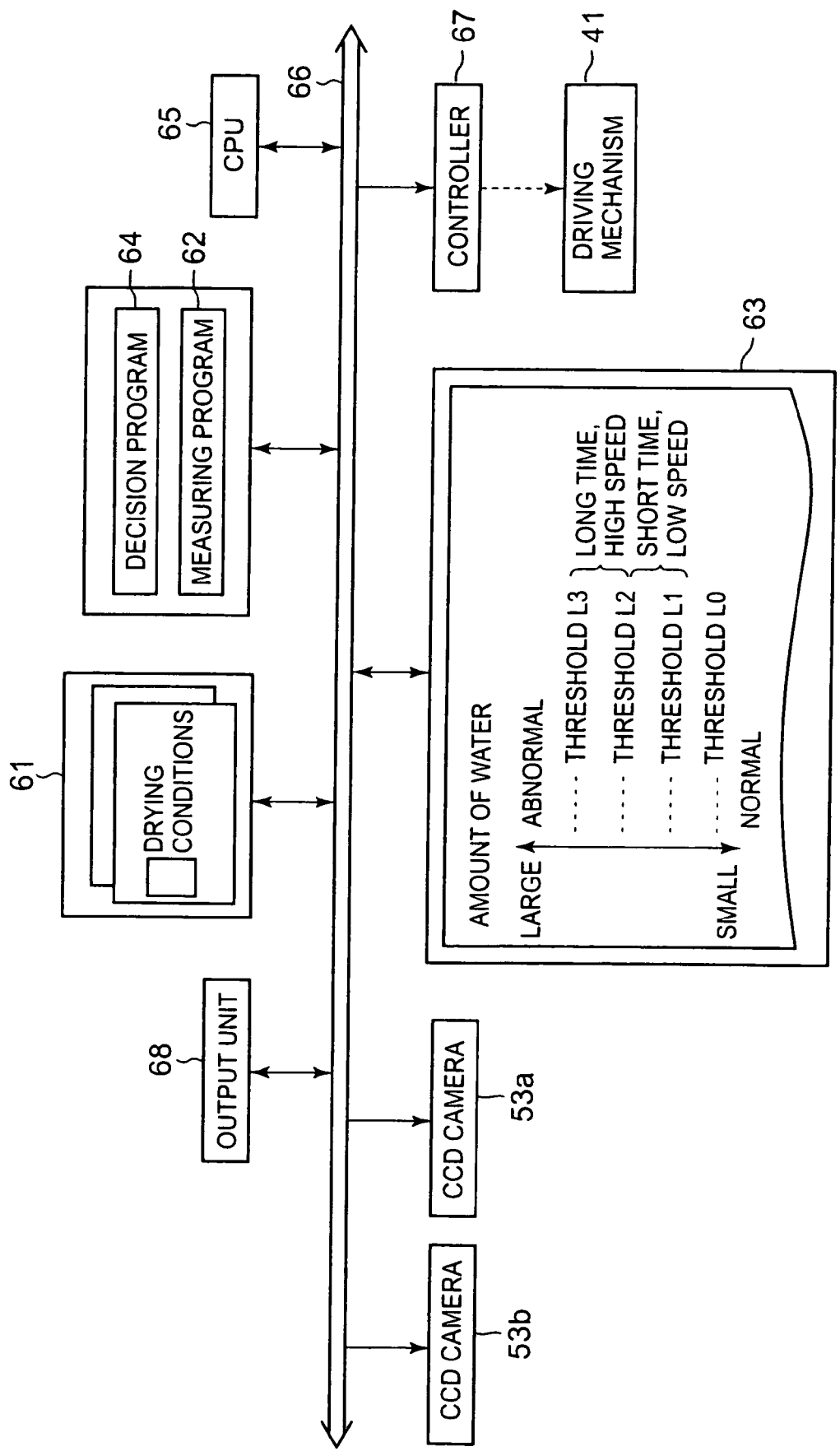
FIG. 6 is a block diagram of assistance in explaining the control functions of the coating and developing system.

Functions of the controller 6 will be described with reference to FIG. 6. Indicated at 61 in FIG. 6 is an image data storage device for storing the image data provided by the CCD cameras 53a and 53b. A measuring program 62 includes instruction for measuring the amount of water adhering to the surface of a wafer W on the basis of the image data. A storage device 63 stores set values specifying drying conditions. A plurality of set thresholds indicating limit amounts of residual water, such as a threshold L0 indicating no residual water, a threshold L1 indicating a little residual water, a threshold L2 indicating much residual water and a threshold L3 indicating extraordinarily much residual water, are stored in the storage device 63. Conditions of a drying process, such as drying time and rotating speed, are determined beforehand for the thresholds L0, L1, L2 and L3; that is, set values of drying conditions respectively corresponding to amounts of water are stored. A decision program 64 includes instructions for deciding whether or not the wafer W needs to be dried and for selecting the set drying conditions on the basis of the amount of detected water. Shown also in FIG. 6 are a CPU 65, a bus 66, a controller 67 for controlling the driving mechanism 41 on the basis of the selected drying conditions and an output unit 68 which send an alarm signal indicating an abnormal process condition to the exposure system B4 when the amount of water adhering to the wafer W is greater than, for example, the threshold L3.

Coating Unit

Figure 7:
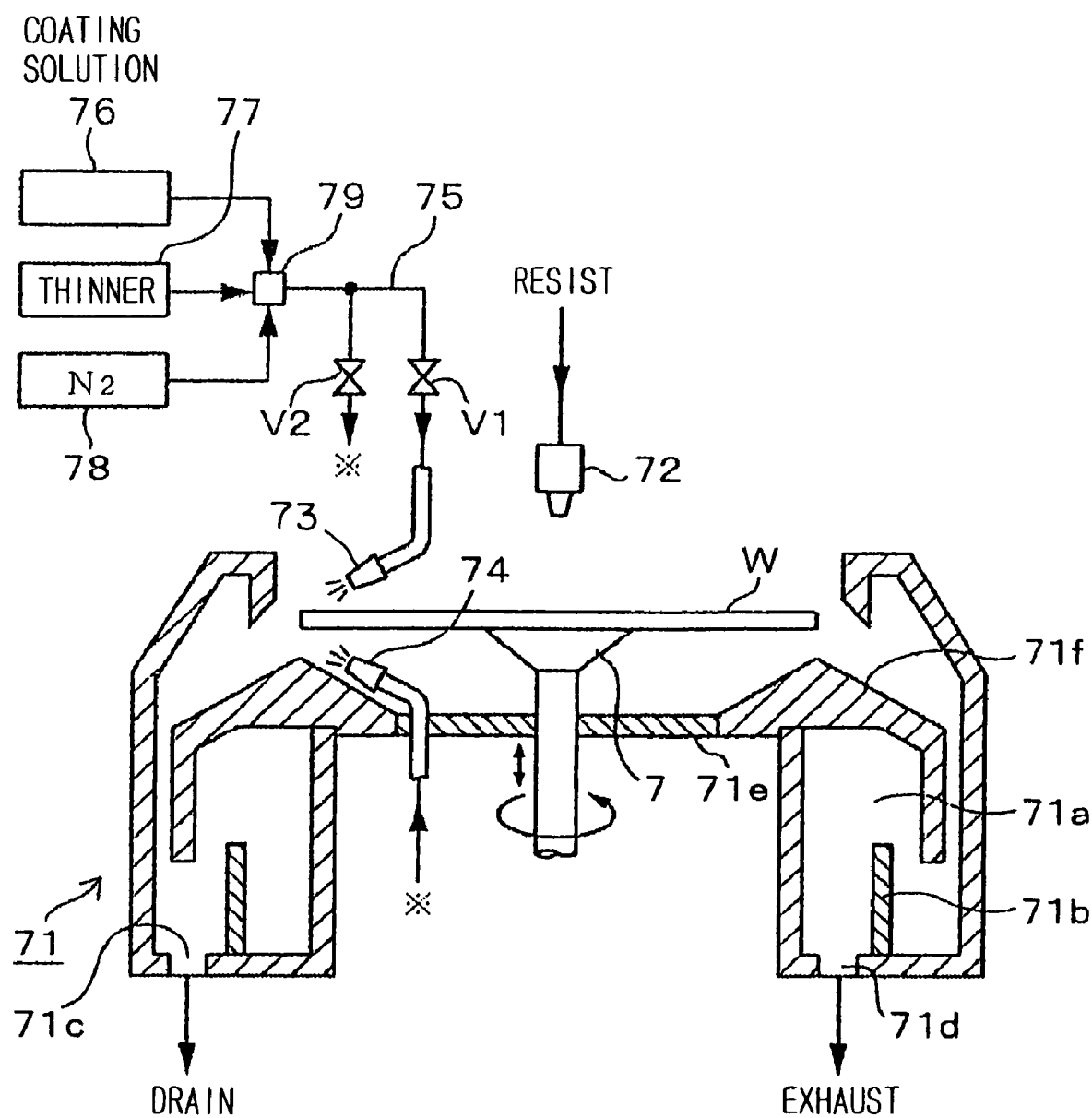
FIG. 7 is a longitudinal sectional view of a coating unit included in the coating and developing system.

The coating unit 27 will be described by way of example with reference to FIG. 7. The coating unit 27 forms a resist film on a surface of a wafer W by applying a resist to the surface of the wafer W and forms a water-repellent film on the surface of the wafer W by applying a water-repellent coating solution to the surface of the wafer W. Referring to FIG. 7, a spin chuck 7 holds a central part of a wafer W seated thereon in a horizontal position by suction. The spin chuck 7 holding the wafer W can be rotated and can be vertically moved. A cup structure 71 having an open upper end is disposed so as to surround the wafer W held by the spin chuck 7. A lower part of the cup structure 71 is bent so as to form a liquid containing space 71a extending under an edge part of the wafer W. The liquid containing space 71a is divided by a partition wall 71b into a drain chamber and an exhaust chamber. A drain port 71c is formed in a part of the bottom wall of the cup structure 71 corresponding to the drain chamber, and a discharge port 71d is formed in a part of the bottom wall of the cup structure 71 corresponding to the exhaust chamber. Indicated at 71e is a circular plate and at 71f is a ring. A resist pouring nozzle 72 having a narrow pouring hole is disposed opposite to, for example, a central part of the upper surface of the wafer W held by the spin chuck 7. The resist pouring nozzle 72 can be moved toward and away from the wafer W. An upper nozzle 73 and a lower nozzle 74 are disposed on the upper and the lower side, respectively, of the wafer W. The upper nozzle 73 and the lower nozzle 74 are spaced from the wafer W and have narrow discharge holes, respectively. A supply line 75 has one end connected to the nozzles 73 and 74 and the other end connected to a selector valve 79 connected to a water-repellent solution source 76, a solvent source 77, such as a thinner source for supplying a thinner for dissolving a resist, and a nitrogen gas source 78 for supplying nitrogen gas for purging the supply line 75. The selector valve 79 connects the supply line 75 selectively to the water-repellent solution source 76, the solvent source 77 or the nitrogen gas source 78. Valves V1 and V2 are placed in the supply lines connected to the nozzles 73 and 74, respectively. The upper nozzle 73 can be horizontally and vertically moved by a lifting mechanism, not shown. Although the coating unit is provided with both a resist film forming means and a water-repellent film forming means in this example, the resist film forming means and the water-repellent film forming means may be included in separate coating units, respectively.

Developing Unit

Figure 8:
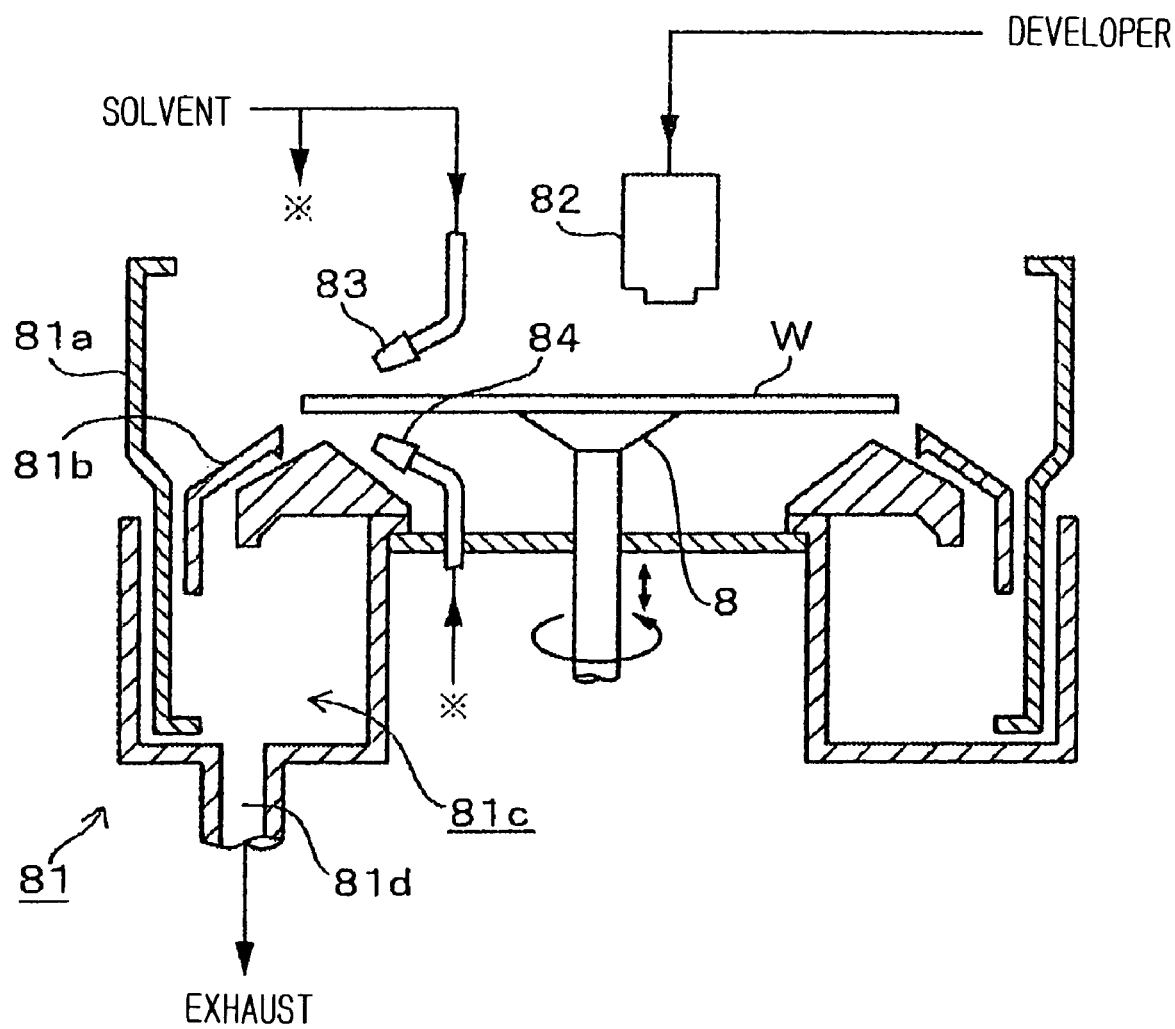
FIG. 8 is a longitudinal sectional view of a developing unit included in the coating and developing system.

The developing unit 28 will be briefly described by way of example with reference to FIG. 8. Referring to FIG. 8, a spin chuck 8 holds a central part of a wafer W seated thereon in a horizontal position by suction. The spin chuck 8 holding the wafer W can be rotated and can be vertically moved. A cup structure 81 having an open upper end is disposed so as to surround the wafer W held by the spin chuck 8. The cup structure 81 includes a vertically movable outer cup 81a, a vertically movable inner cup 81b and a liquid collecting cup 81c. A drain port 81d for draining a liquid is formed in the liquid collecting cup 81c. An elongate developer pouring nozzle 82 provided with a straight developer pouring slit is disposed opposite to the upper surface of the wafer W. The length of the developer pouring slit is equal to or greater than the diameter of the wafer W. A driving mechanism, not shown, moves the developer pouring nozzle 82 horizontally and vertically. An upper solvent spraying nozzle 83 and a lower solvent spraying nozzle 84 are disposed on the upper and the lower side, respectively, of the wafer W. The upper solvent spraying nozzle 83 and the lower solvent spraying nozzle 84 are water-repellent film removing means which pour a solvent that does not dissolve a resist film and dissolves a water-repellent film on the wafer W. A driving mechanism, not shown, moves the upper solvent spraying nozzle 83 vertically and horizontally. Although the developing unit is provided with both a developing means and a water-repellent film removing means in this example, the developing means and the water-repellent film removing means may be included in separate developing units, respectively.

Heating Unit

The heating unit 38 for carrying out a PEB process will be briefly described by way of example with reference to FIG. 9. Referring to FIG. 9, a stage 91 is placed in a casing 9. A cooling arm 92 provided with a cooling means, not shown, and a heating plate 95 provided with a heater 94 are disposed in a front part and a back part, respectively, of the upper surface of the stage 91. The cooling arm 92 receives a wafer W from the first substrate carrying device 31A advanced through an opening, not shown, into the casing 9 and advances to carry the wafer W to the heating plate 95. The cooling arm 92 cools the wafer W for rough cooling while the cooling arm 92 is carrying the wafer W to the heating plate 95. Substrate support pins 96 cooperate with the first substrate carrying device 31A to place the wafer W on the cooling arm 92. Substrate support pins 97 cooperate with the cooling arm 92 to place the wafer on the heating plate 95.

Figure 10:
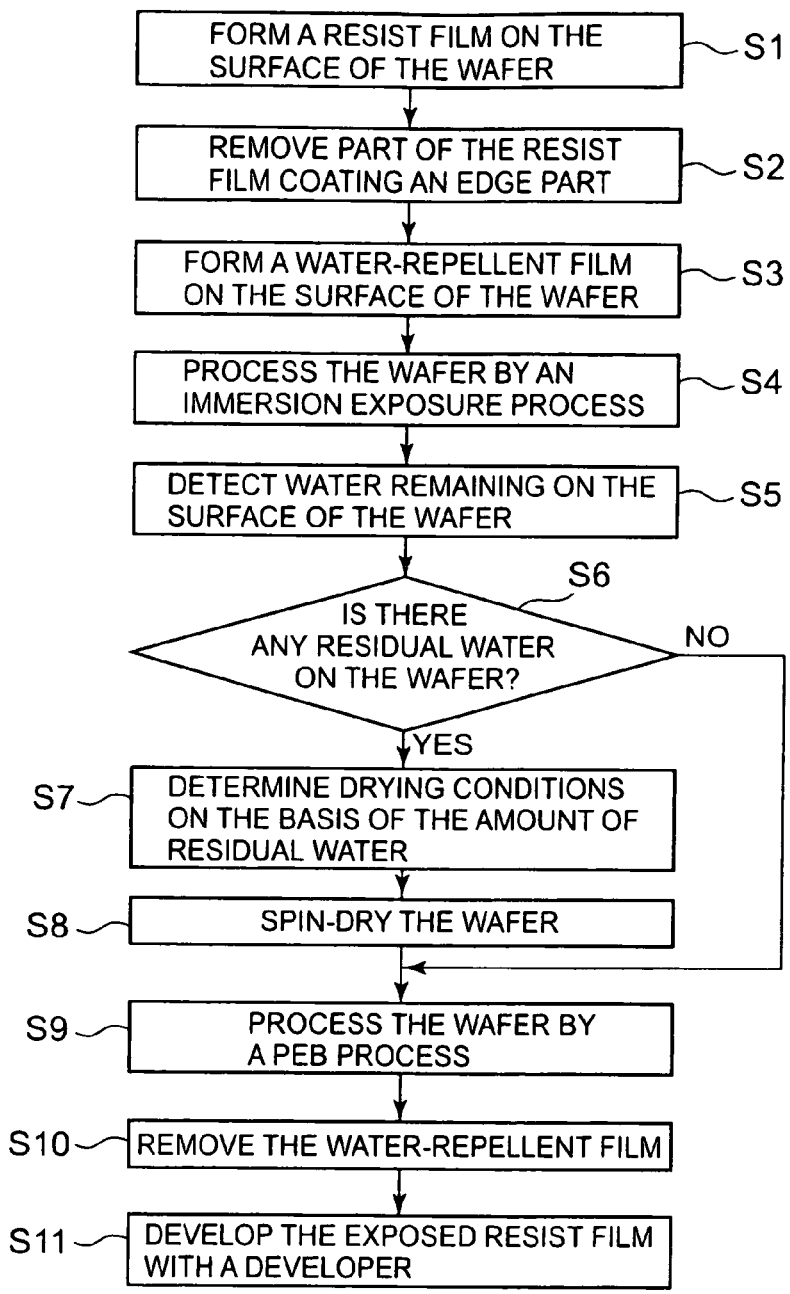
FIG. 10 is a flow chart of a wafer processing procedure to be carried out by the coating and developing system.
Figure 11:
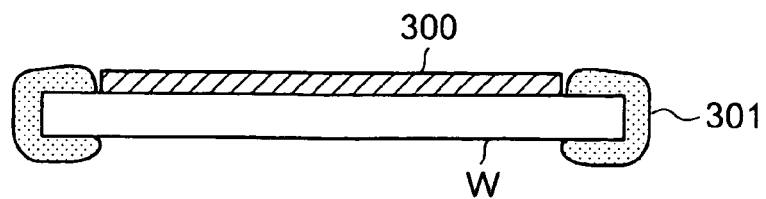
FIG. 11 is a sectional view of a wafer processed by a coating step.

Operations of the coating and developing system for forming a resist film on a wafer W, namely, a substrate, and developing the resist film formed on the wafer W after the resist film has been processed by an immersion exposure will be described with reference to FIGS. 10 and 11. A coating process and a developing process which will be described below are only preferable examples and do not impart any restrictions on the present invention. A carrier 2 holding wafers W is delivered to the carrier station 20 and is mounted on the carrier support table 20a. The gate 21 is opened and the lid of the carrier 2 is removed. Then, the transfer device A1 takes out the wafer w from the carrier 2. Then, the wafer W is transferred through a transfer unit, not shown, included in the shelf unit U1 to the main carrying device A2. One of the units of the shelf units U1 to U3 processes the wafer W by, for example, a hydrophobicity imparting process and cooling process for the pretreatment of the wafer W prior to the coating process. In another case, the wafer W is processed by an antireflection film forming process instead of by the hydrophobicity imparting process to form an antireflection film on the wafer W.

Subsequently, the main carrying device A2 carries the wafer W into the coating unit 27 and the wafer W is held by the spin chuck 7. The resist pouring nozzle 72 is advanced to position the pouring hole at a pouring position slightly above a central part of the upper surface of the wafer W. Then, the spin chuck 7 holding the wafer W is rotated about a vertical axis and a resist is poured at a predetermined pouring rate onto a central part of the upper surface of the wafer W. The resist poured onto the wafer W is spread radially over the upper surface of the wafer W by centrifugal force to coat the upper surface of the wafer W with a thin liquid resist film (Step S1). Then, pouring the resist through the resist pouring nozzle 72 is stopped and the wafer W is rotated at an increased rotating speed for spin-drying. Consequently, a solvent contained in the liquid resist is vaporized and the resist remaining on the wafer W forms a resist film 300.

Then, the wafer W is rotated about the vertical axis, a thinner is sprayed on an edge part of the wafer W by the nozzles 73 and 74 to dissolve and remove a part of the resist film 300 coating the edge part of the wafer W (Step S2). After purging the supply line 75 with nitrogen gas, a coating solution is sprayed through the nozzles 73 and 74 on edge parts of the upper and the lower surface of the wafer W to form a water-repellent film 301 coating the edge parts of the upper and the lower surface of the wafer W and the side surface of the wafer W as shown in FIG. 11 (Step S3). The water-repellent film 301 restrains a liquid forming a liquid film for immersion exposure from dripping from the edge of the wafer W during the immersion exposure process. Then, supply of the coating solution is stopped and the wafer W is rotated at a high rotating speed for spin-drying. Then, the main carrying device A2 carries out the wafer W from the coating unit 27 and carries the wafer W to the heating unit. The heating unit heats the wafer W at a predetermined temperature by a baking process. The water-repellent film 301 may be formed so as to coat the upper surface of the wafer W entirely and the water-repellent film 301 may be formed without removing parts of the resist film coating the edge parts of the wafer W.

The wafer W processed by the baking process is cooled by the cooling unit. Then, the wafer W is transferred through the transfer unit of the shelf unit U3 and the interface block B3 to the exposure system B4. As mentioned in connection with the description of the background art, the exposure device 1 is disposed opposite to the upper surface of the wafer W to process the wafer W by the immersion exposure process. (Step S4).

After the wafer W has been processed by the immersion exposure process, the second substrate carrying device 31B carries the wafer W from the exposure system B4 through the opening 52 into the casing 5 of the inspection unit 37. Then, the wafer W is supported on the substrate support pins 51 in a substantially horizontal position. Then, the CCD cameras 53a and 53b take images of the upper surface of the wafer W and send image data representing the images to the controller 6. The image data is stored in the storage device 61 and is analyzed according to the measuring program 62 to measure the amount of water adhering to the upper surface of the wafer W (Step S5). Subsequently, the decision program 64 is started to determine the level of the amount of water remaining on the wafer W. It is decided that the wafer W does not need to be subjected to the drying process if there is no residual water on the wafer W and the level of the amount of residual water is below the threshold L0 or the level of the amount of residual water remaining on the wafer W is below the lowest threshold L1 (Step S6). If the level of the amount of residual water on the wafer W exceeds the threshold, drying conditions are determined for the wafer W according to the amount of redisual water on the basis of information stored in the storage device 63 and are stored in the storage device 61 for the wafer W (Step S7). If the level of the amount of residual water is higher than the threshold L3, the output unit 68 sends an alarm signal to the exposure system B4.

The first substrate carrying device 31A carries out the wafer w from the inspection unit 37 and, if the wafer W needs to be subjected to the drying process, carries the wafer W into the drying unit 35. Then, the spin chuck 4 holds the wafer W. Then, set drying conditions including a rotating speed and a rotating time suitable for drying the wafer W are read from the storage device 61. The spin chuck 4 holding the wafer W is rotated according to the drying conditions for a spin-drying operation (Step S8).

The first substrate carrying device 31a takes out the wafer W from the drying unit 35 after the drying process has been completed or takes out the wafer W which does not need to be subjected to the drying process from the inspection unit 37, and carries the wafer W into the heating unit (PEB) 38. The wafer W is placed on the cooling arm 92 for rough cooling. Then, the wafer W is placed on the heating plate 95 and the resist film on the wafer W is heated at a predetermined temperature. Consequently, an acid produced by an acid-producing component contained in the resist forming exposed parts of the resist film is diffused in the resist film. The resist forming the resist film undergoes a chemical reaction augmented by the catalytic action of the acid. The exposed parts of the resist film become soluble in a developer if the resist is a positive resist or become insoluble in a developer if the resist is a negative resist (Step S9).

Then, the wafer W is transferred through the cooling arm 92 and is carried out from the heating unit 38 by the first substrate carrying device 31A. Then, the wafer W is transferred from the first substrate carrying device 31A to the main carrying device A2. The main carrying device A2 carries the wafer W into the developing unit 28 and transfers the wafer W to the spin chuck 8. In the developing unit 28, the spin chuck 8 holding the wafer W rotates about a vertical axis, a solvent is sprayed on the water-repellent film formed on the wafer W through the solvent spraying nozzles 83 and 84 to dissolve and remove the water-repellent film (Step S10). Then, the spin chuck 8 holding the wafer W is stopped, the developer is poured through the developer pouring nozzle 82 while the developer pouring nozzle is moved from a position on one side of the wafer W toward a position on the other side of the wafer W to wet the upper surface of the wafer W uniformly with the developer. Consequently, parts of the resist film soluble to the developer are dissolved and a resist mask of a predetermined pattern is formed on the upper surface of the wafer W (Step S11).

The liquid detectors inspect the surface of the wafer W processed by the immersion exposure process for water. The wafer W is delivered to the next process, such as the PEB process if there is not any residual water on the surface of the wafer W. The wafer W is subjected to the PEB process after the wafer W has been processed by the drying process if there is some residual water on the surface of the wafer W. Thus the units for carrying out the following processes can be prevented from being wetted with water. Since not all the wafers W are subjected to the drying process, the reduction of the throughput can be restrained. The wafer W subjected to the PEB process is not wetted with water at all or is wetted very scarcely with water. Therefore, the surface of the wafer W is heated in a satisfactory temperature profile and the chemical reaction in the presence of the acid catalyst can be promoted in an intrasurface uniformity. Consequently, a resist pattern accurate in line width and having intrasurface uniformity. Although the coating and developing method has bee described on an assumption that the next process is the PEB process, the next process may be the heating process or the cooling process to be carried out by the precision temperature adjusting unit (CPL2) 39 for adjusting the temperature of the wafer W. The heating unit (PEB) 38 and the precision temperature adjusting units (CPL2) 39 do not need necessarily included in the interface block B3 and may be included, for example, in any one of the shelf units U1 to U3 of the processing block B2.

When it is decided on the basis of the result of detecting operation of the liquid detectors that the wafer W needs to be dried, the wafer W is dried under the drying conditions specified for the level of the amount of residual water on the wafer W. Therefore, the wafer W is dried under proper drying conditions such that the wafer W is not dried by an excessive drying operation when the wafer W is lightly wetted and the wafer is not dried by an insufficient drying operation when the wafer W is heavily wetted. Thus wafers W can be dried in the same dry state and can be surely heated in a high temperature profile.

Figure 12A:
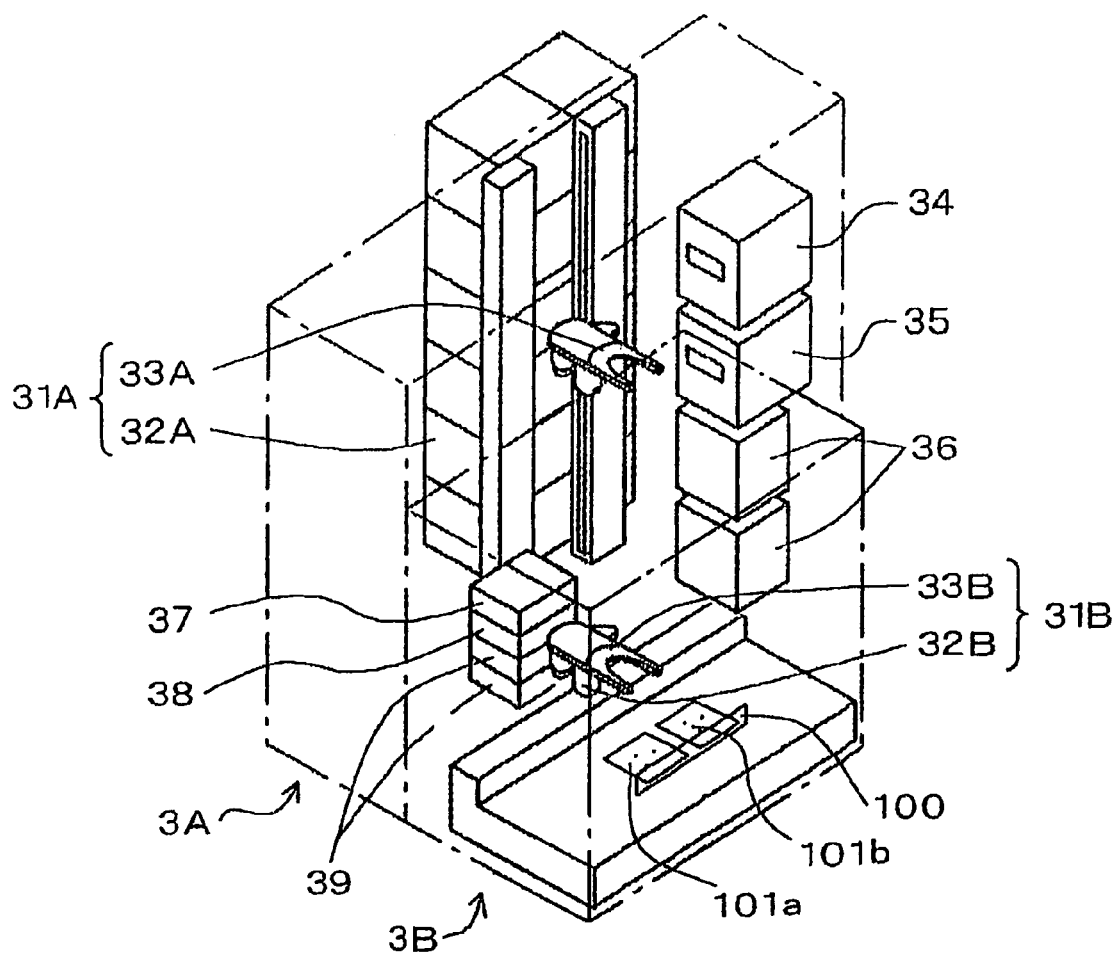
FIG. 12 is a perspective view of another interface block which can be included in the coating and developing system.
Figure 12B:
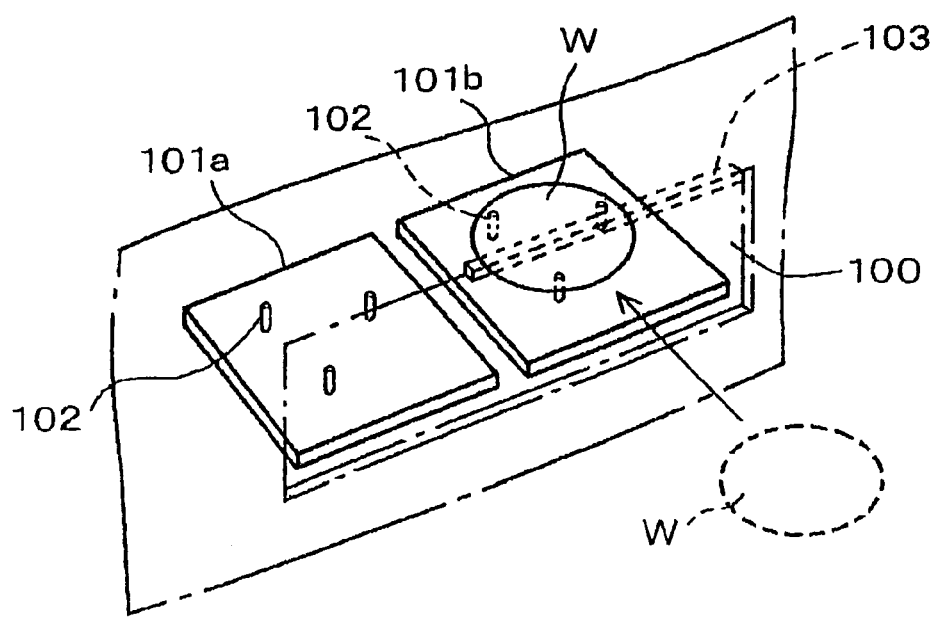

An interface block B3 in another example will be described with reference to FIG. 12. This interface block B3 is provided with two transfer stages 101a and 101b in a lateral arrangement in a second transfer chamber 3B. A wafer W is transferred through an opening 100 between the second transfer chamber 3B and the exposure system B4. Each of the transfer stages 101a and 101b is provided with, for example, three substrate support pins 102, namely, substrate support members, for supporting a wafer W thereon. The substrate support pins 102 are set upright on the upper surface of each of the transfer stages 101a and 101b. CCD camera1 53a and 53b, not shown, namely, liquid detectors, for detecting water remaining on the wafer W supported in a horizontal position on the substrate support pins 102 are disposed above the transfer stage 101b. In this example, the transfer stage 101b corresponds to the inspection unit. To subject the wafer W to the exposure process, the second substrate carrying device 31B places the wafer @ on the transfer stage 101a, the substrate carrying device (substrate carrying means), not shown, of the exposure system B4 carries the wafer W into the exposure system B4. The substrate carrying device, not shown, carries the wafer W between the interface block b3 and the exposure system B4. The second carrying device 31B transfers the wafer W between the processing block B2 and the interface block B3. The substrate carrying device of the exposure system B4 carries the wafer W processed by the exposure process to the transfer stage 101b. Then the CCD cameras 53a and 53b form images of the surface of the wafer W. Then, the second substrate carrying device 31B carries the wafer W.

The wafer W is subjected to the drying process or is transferred to the processing block B2 without being processed by the drying process depending on the result of detection. The effect of this interface block B3 is the same as that of the foregoing interface block B3. The interface block B3 may be provided with a single transfer stage for both sending out and receiving the wafer W instead of the transfer stage 101a for sending the wafer W from the interface block B3 and the transfer stage 101a for receiving the wafer W from the exposure system B4.

A gas blowing nozzle 103 may be disposed on the upper side of the opening 100 and a gas of a predetermined temperature, such as dry air or nitrogen gas, may blown onto the surface of the wafer W being transferred from the exposure system B4 through the opening 100 to the interface block B3 to dry the wafer W at the boundary between the exposure system B4 and the interface block B3. The wafer W, from which water is removed by blowing the gas onto the surface of the wafer W when the wafer W passes the opening 100, is placed on the transfer stage 101b. The surface of the wafer W mounted on the transfer stage 101b is inspected to see if there is any residual water on the wafer W. The wafer W is carried into the drying unit 35 to dry the wafer W completely if there is residual water on the wafer W. The effect of this constitution is the same as the foregoing effect. The constitution including the gas blowing nozzle 103 at the opening 100 to blow a gas onto the wafer W being transferred from the exposure system B4 to the interface block B3 may be applied to the interface block b3 shown in FIG. 3.

Figure 13:
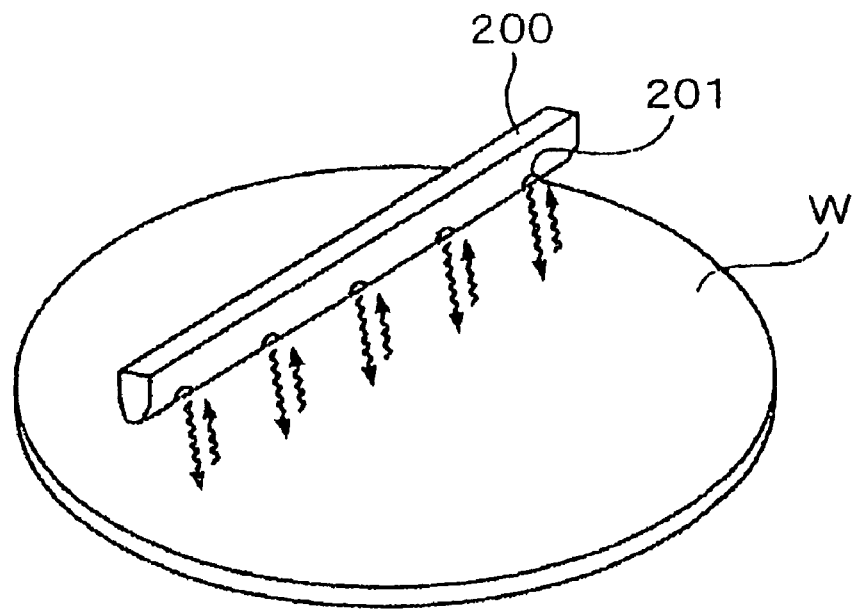
FIG. 13 is a perspective view of a liquid detector which can be included in the inspection unit.

The liquid detector is not limited to an image pick-up device, such as the CCD camera 53a (53b); the liquid detector may be, for example, an optical liquid detector, such as a photosensor including a light emitting device and a light receiving device, capable of detecting light emitted onto the surface of the wafer W by the light emitting device and scattered by the surface of the wafer W by the light receiving device. Water on the surface of the wafer W is detected through the detection of reflected light reflected at reflection angles changed by the water on the wafer W. More concretely, a laterally movable, long base member 200 having a length equal to or greater than the diameter of a wafer W and provided in its lower surface with a plurality of photosensors 201 each including a light emitting device and a light receiving device and longitudinally arranged at short intervals is disposed opposite to the surface of the wafer W as shown in FIG. 13. The base member 200 is moved relative to the wafer W to detect water on the surface of the wafer W. In FIG. 13, the photosensors 201 are widely spaced apart and the casing 5 is omitted for convenience. The liquid detector shown in FIG. 13 can detect residual water on the surface of the wafer W and the effect of the liquid detector is the same as that of the foregoing liquid detector.

Figure 14:
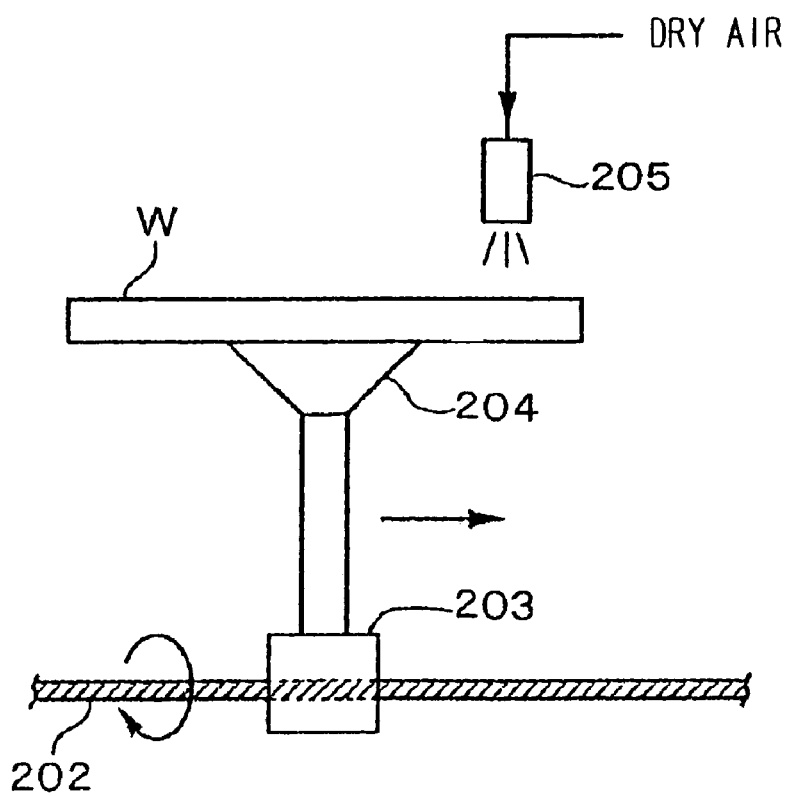
FIG. 14 is a schematic side elevation of a drying device included in the drying unit.
Figure 15:
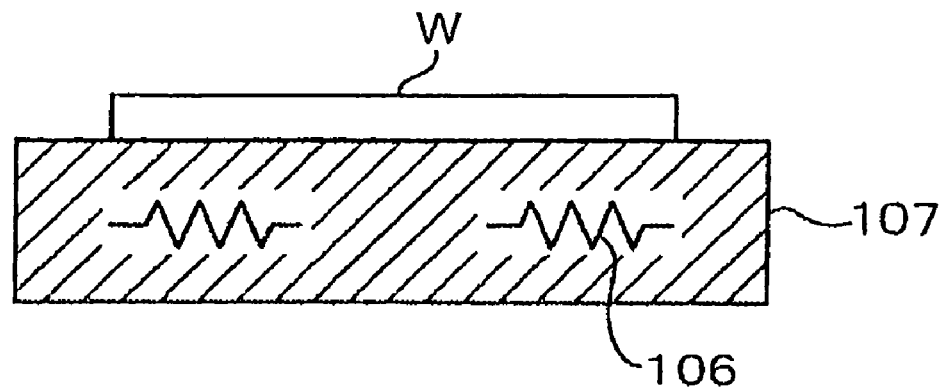
FIG. 15 is a view of assistance in explaining a method of processing a resist film formed on a surface of a wafer by an immersion exposure process.
Figure 16:
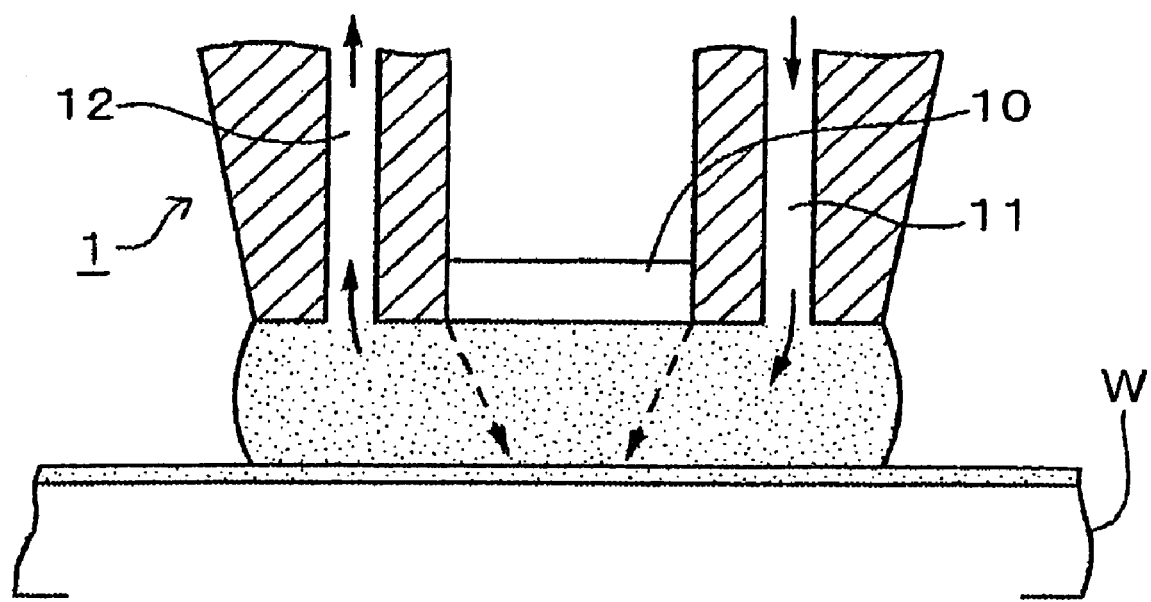
FIG. 16 is a view of assistance in explaining a method of processing a resist film formed on a surface of a wafer by an immersion exposure process.

The wafer drying method is not limited to the spin-drying method using the spin chuck. For example, a wafer W may be dried by a drying mechanism shown in FIG. 14. The drying mechanism includes a substrate holding member 204, a ballscrew mechanism including a threaded rod 202 and a threaded nut 203 linked to the threaded rod 202 and connected to the substrate holding member 204 by a shaft, and a gas blowing nozzle 205 provided with a gas blowing slit of a length equal to or longer than the diameter of the wafer W. Residual water on the surface of the wafer W is blown away to dry the wafer W by blowing, for example, dry air in an air curtain through the gas blowing slit of the gas blowing nozzle 205 and moving the wafer W past the air curtain. The effect of this drying method is the same as the foregoing effect. A wafer W may be dried by placing the wafer W on a heating plate 207 internally provided with a heater 206 as shown in FIG. 15 and heating the wafer at temperatures in the range of, for example, 40 to 50° C. to vaporize the residual water. The gas blow through the gas blowing nozzle 205 is not limited to dry air; the gas may be nitrogen gas or a gas heated at a predetermined temperature.

The liquid detector does not need necessarily disposed in the inspection unit 37. For example, the liquid detector may be attached to the arm 33B of the substrate carrying device 31B to detect water remaining on the surface of a wafer w while the substrate carrying device 31B is carrying the wafer W. The effect of this constitution is the same as the foregoing effect.

The substrate to be processed by the coating and developing system of the present invention is not limited to a wafer W and the coating and developing system of the present invention is applicable to processing, for example, a substrate for a LCD and a substrate for forming a reticle, namely, a photomask, by coating and developing processes.

The invention claimed is:

1. A coating and developing system comprising:
   a carrier station for loading a carrier containing a plurality of substrates from outside of the carrier station, and for unloading developed substrates that are contained in the carrier to the outside;
   a processing block including a coating unit and a development unit, the coating unit for coating a surface of a substrate with a resist film, the developing unit for processing the coated substrate by an immersion exposure process that forms a liquid film on the surface of the resist film for immersion exposure;
   an interface block including a substrate transfer part, an inspection unit, a control unit, and a drying unit, the interface block disposed adjacent to the processing block and connected to an exposure system for performing an immersion exposure process to a substrate, wherein
      the substrate transfer part receives the coated substrate from the processing block, sends the coated substrate to the exposure system, receives the exposed substrate from the exposure system, and sends the exposed substrate to the processing block,
      the inspection unit includes a substrate support device for supporting the exposed substrate and a liquid detector for detecting at least a liquid used for forming the liquid film and adhering to the surface of the substrate supported by the substrate support device,
      the control unit determines whether or not the substrate needs to be processed by a drying process on the basis of a result of detection made by the liquid detector of the inspection unit, and
      the drying unit dries the substrate if the control unit decides that the substrate needs to be processed by a drying process.

2. The coating and developing system according to claim 1, wherein
   the control unit sends a signal indicating an abnormal state to the exposure system when the result of detection made by the liquid detector indicates an abnormal state.

3. The coating and developing system according to claim 1, wherein
   the control unit determines drying conditions for drying the substrate on the basis of the result of detection made by the liquid detector of the inspection unit, and to control drying operations of the drying unit on the basis of the drying conditions.

4. The coating and developing system according to claim 1 wherein the interface block further comprises:
   a heating unit for processing the exposed substrate by a heating process before the exposed substrate is subjected to a developing process; wherein the liquid adhering to the surface of the substrate is detected by the liquid detector of the inspection unit at least before the substrate is subjected to the drying process.

5. The coating and developing system according to claim 1, wherein the interface block further includes:
   a transport stage on which the exposed substrate is transferred from a substrate transfer means of the exposure system to the substrate transfer part of the interface block, wherein
   the substrate support device of the inspection unit serves also as the transport stage.

6. The coating and developing system according to claim 5 wherein the substrate transfer part comprises:
   a first substrate carrying device for carrying the substrate between the processing block and the interface block; and
   a second carrying device for carrying the substrate between the interface block and the exposure system;
   wherein the substrate support device of the inspection unit serves also as a transfer device on which the substrate is placed when the substrate is transferred between the first and the second carrying device.

* * * * *